US012597955B2

(12) United States Patent
Sawada

(10) Patent No.: US 12,597,955 B2
(45) Date of Patent: Apr. 7, 2026

(54) HIGH FREQUENCY MODULE AND COMMUNICATION APPARATUS

(71) Applicant: Murata Manufacturing Co., Ltd., Kyoto (JP)

(72) Inventor: Yoichi Sawada, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 475 days.

(21) Appl. No.: 18/050,073

(22) Filed: Oct. 27, 2022

(65) Prior Publication Data

US 2023/0074286 A1 Mar. 9, 2023

Related U.S. Application Data

(63) Continuation of application No. PCT/JP2021/018880, filed on May 18, 2021.

(30) Foreign Application Priority Data

May 27, 2020 (JP) ................................. 2020-092306

(51) Int. Cl.
 *H04B 1/38* (2015.01)
 *H05K 1/02* (2006.01)
(52) U.S. Cl.
 CPC .................. *H04B 1/38* (2013.01); *H05K 1/02* (2013.01)
(58) Field of Classification Search
 CPC .......... H04B 1/38; H05K 1/02; H05K 3/4007; H05K 1/0206; H05K 1/0298;
 (Continued)

(56) References Cited

U.S. PATENT DOCUMENTS

2010/0109052 A1 5/2010 Nakajima et al.
2012/0138337 A1* 6/2012 Kim ..................... H05K 3/3485
174/250

(Continued)

FOREIGN PATENT DOCUMENTS

JP 2010-267944 A 11/2010
JP 2018-137522 A 8/2018
(Continued)

OTHER PUBLICATIONS

International Search Report for PCT/JP2021/018880 dated Aug. 17, 2021.

*Primary Examiner* — Quoc Thai N Vu
(74) *Attorney, Agent, or Firm* — McDonald Hopkins LLC

(57) ABSTRACT

A high frequency module includes a module substrate that includes main surfaces facing each other, a power amplifier that is disposed on the main surface and capable of amplifying a transmission signal, an external connection terminal that is disposed on the main surface and set to a ground potential, and a via conductor that is formed inside the module substrate and connects the main surfaces. One end of the via conductor is bonded to a ground electrode of the power amplifier on the main surface, and the other end of the via conductor is bonded to an end surface of the external connection terminal on the main surface. An area Rb of an end surface that is opposite to the end surface of the external connection terminal is larger than an area of a cut surface that is in parallel to the main surface of the external connection terminal.

21 Claims, 4 Drawing Sheets

(58) Field of Classification Search
    CPC ...... H05K 1/0243; H05K 1/113; H05K 1/114;
            H05K 1/181; H05K 1/16; H01L 23/66;
            H01L 23/49827; H01L 23/49822; H03F
                        3/195; H03F 2200/451
    See application file for complete search history.

(56)                     References Cited

U.S. PATENT DOCUMENTS

| | | |
|---|---|---|
| 2015/0084180 A1 | 3/2015 | Seko et al. |
| 2018/0211897 A1* | 7/2018 | Yang .................... H10D 10/021 |
| 2019/0364660 A1 | 11/2019 | Sato et al. |
| 2021/0233865 A1* | 7/2021 | Tarui .................... H01Q 21/065 |

FOREIGN PATENT DOCUMENTS

| | | | |
|---|---|---|---|
| WO | 2014/020783 A1 | 2/2014 | |
| WO | 2018/150724 A1 | 8/2018 | |

* cited by examiner

HIGH FREQUENCY MODULE AND COMMUNICATION APPARATUS

CROSS REFERENCE TO RELATED APPLICATION

This is a continuation of International Application No. PCT/JP2021/018880 filed on May 18, 2021 which claims priority from Japanese Patent Application No. 2020-092306 filed on May 27, 2020. The contents of these applications are incorporated herein by reference in their entireties.

BACKGROUND OF THE DISCLOSURE

Field of the Disclosure

The present disclosure relates to a high frequency module and a communication apparatus.

Description of the Related Art

A power amplifier that amplifies a high frequency transmission signal is mounted on mobile communication apparatuses such as cellular phones. In Patent Document 1, a front end circuit (RF module) including a PA circuit (transmission amplifier circuit) that transfers a transmission signal and an LNA circuit (reception amplifier circuit) that transfers a reception signal is disclosed. A PA control unit that controls amplification characteristics of a power amplifier is disposed in the transmission amplifier circuit, and an LNA control unit that controls amplification characteristics of a low noise amplifier is disposed in the reception amplifier circuit.

Patent Document 1: Japanese Unexamined Patent Application Publication No. 2018-137522

BRIEF SUMMARY OF THE DISCLOSURE

In the RF module disclosed in Patent Document 1, a large amount of heat is generated by the power amplifier. Thus, heat dissipating means for the power amplifier needs to be provided. Meanwhile, in the case where the RF module is used for a high frequency front end circuit of a mobile terminal, the RF module is required to be compact in size. That is, the size of the RF module used for a high frequency front end circuit needs to be reduced while still accommodating a heat dissipating means for the power amplifier.

The present disclosure has been designed to solve the above-mentioned problem, and a possible benefit of the present disclosure is to provide a high frequency module and a communication apparatus of a compact size with excellent heat dissipation characteristics.

In order to achieve the above possible benefit, a high frequency module according to an aspect of the present disclosure includes a module substrate that has a first main surface and a second main surface facing each other; a power amplifier that is disposed on the first main surface and capable of amplifying a transmission signal; a first external connection terminal that is disposed on the second main surface and set to a ground potential; and a via conductor that is formed inside the module substrate and connects the first main surface to the second main surface. One end of the via conductor is bonded to a ground electrode of the power amplifier on the first main surface, and an other end of the via conductor is bonded to a first end surface of the first external connection terminal on the second main surface. An area of a second end surface that is opposite to the first end surface of the first external connection terminal is larger than an area of a cut surface that is in parallel to the second main surface of the first external connection terminal.

According to the present disclosure, a high frequency module and a communication apparatus of a compact size with excellent heat dissipation characteristics can be provided.

Figures 2A, 2B:
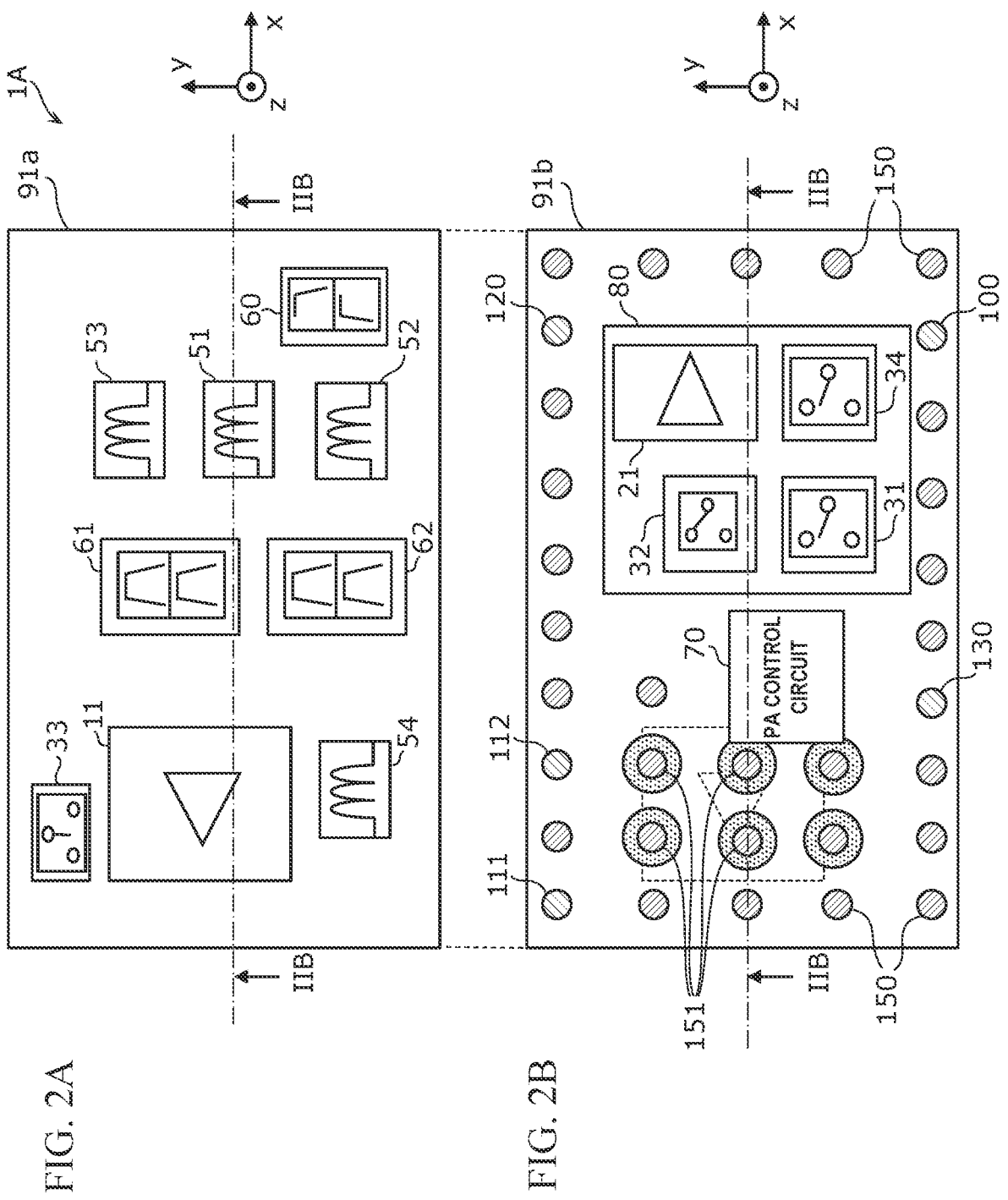

Each of FIGS. 2A and 2B is a schematic diagram of the planar configuration of a high frequency module according to an example.

Figure 2C:
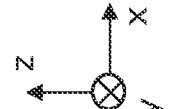
Figure 2C:
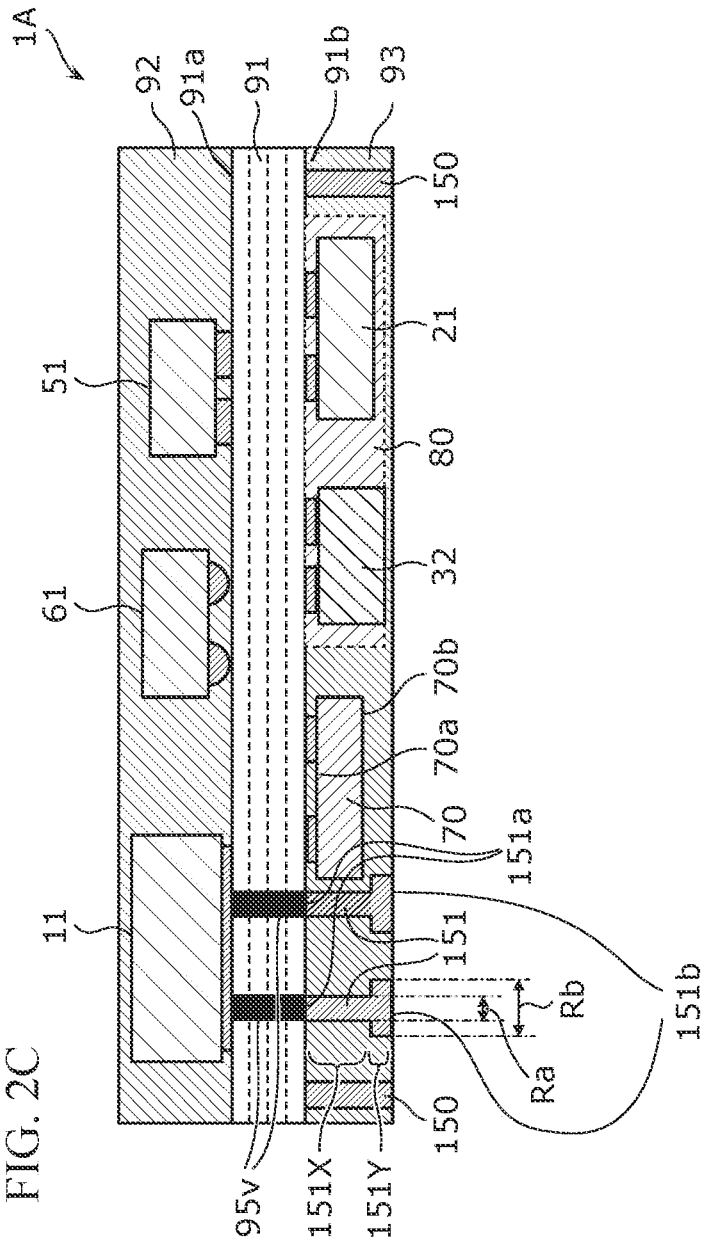

FIG. 2C is a schematic diagram of the cross-section configuration of a high frequency module according to the example.

Figure 3A:
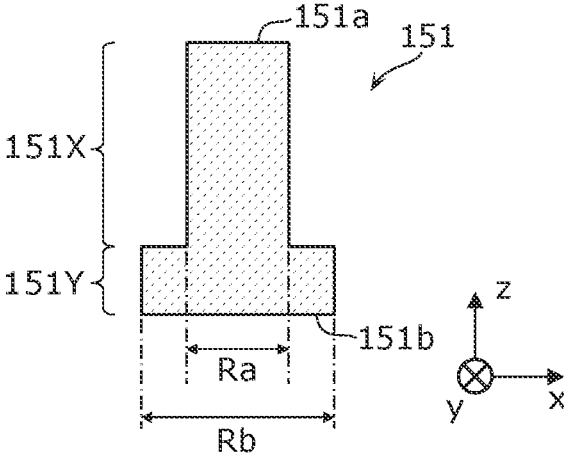

FIG. 3A is a schematic diagram of the cross-section configuration of an external connection terminal according to a first modification.

Figure 3B:
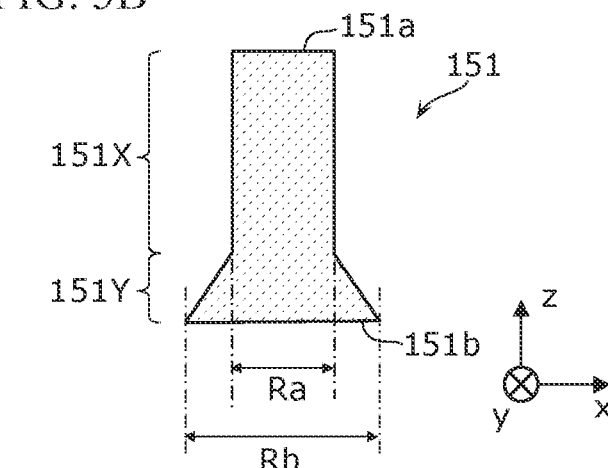

FIG. 3B is a schematic diagram of the cross-section configuration of an external connection terminal according to a second modification.

Figure 3C:
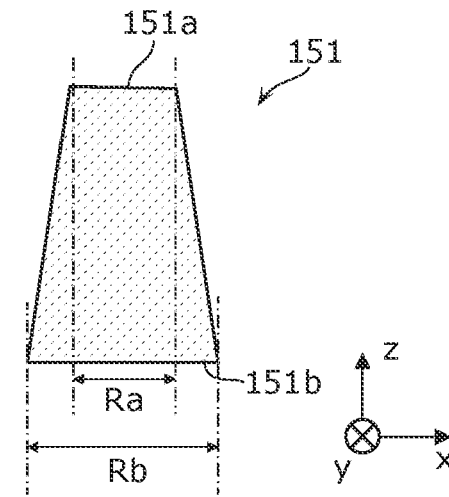

FIG. 3C is a schematic diagram of the cross-section configuration of an external connection terminal according to a third modification.

DETAILED DESCRIPTION OF THE DISCLOSURE

Hereinafter, the embodiments of the present disclosure will be described in detail. The embodiments described below each illustrate a comprehensive or specific example. The numerical values, shapes, materials, component elements, arrangements of the component elements, manners in which the component elements are connected, and so on illustrated in the embodiments described below are merely examples and are not intended to limit the present disclosure. Among the component elements in examples and modifications described below, component elements that are not described in independent claims are described as arbitrary component elements. In addition, the sizes of or the size ratios between the component elements illustrated in the drawings are not necessarily precise. In the drawings, substantially the same components are denoted by the same reference signs, and duplicate description of those components may be omitted or simplified.

Furthermore, hereinafter, a term that indicates the relationship between elements such as parallel or perpendicular, a term that indicates the shape of an element such as rectangular, and a numerical range represent not only strict meanings but also cover substantially equivalent ranges with a difference of, for example, about several percent.

Furthermore, hereinafter, regarding A, B, and C mounted on a substrate, "C is disposed between A and B in a plan view of a substrate (or a main surface of a substrate)" means that at least one of a plurality of line segments that connect an arbitrary point in A to an arbitrary point in B passes through a region of C in a plan view of a substrate. Furthermore, a plan view of a substrate means that the substrate and a circuit element mounted on the substrate are viewed, being orthographically projected onto a plane parallel to the main surface of the substrate.

Furthermore, hereinafter, "A is disposed on a first main surface of a substrate" means not only the state in which A is directly mounted on a first main surface but also the state in which A is mounted in a space near the first main surface, out of the space near the first main surface and a space near a second main surface that are isolated by the substrate. That is, the above expression includes the state in which A is mounted on the first main surface with another circuit element, electrode, or the like interposed therebetween.

Furthermore, hereinafter, a "transmission path" means a transfer line that includes a wire for transferring a high frequency transmission signal, an electrode directly connected to the wire, a terminal directly connected to the wire or the electrode, and the like. Furthermore, a "reception path" means a transfer line that includes a wire for transferring a high frequency reception signal, an electrode directly connected to the wire, a terminal directly connected to the wire or the electrode, and the like. Furthermore, a "signal path" means a transfer line that includes a wire for transferring a high frequency signal, an electrode directly connected to the wire, a terminal directly connected to the wire or the electrode, and the like.

Embodiment

1. Circuit Configuration of High Frequency Module 1 and Communication Apparatus 5

Figure 1:
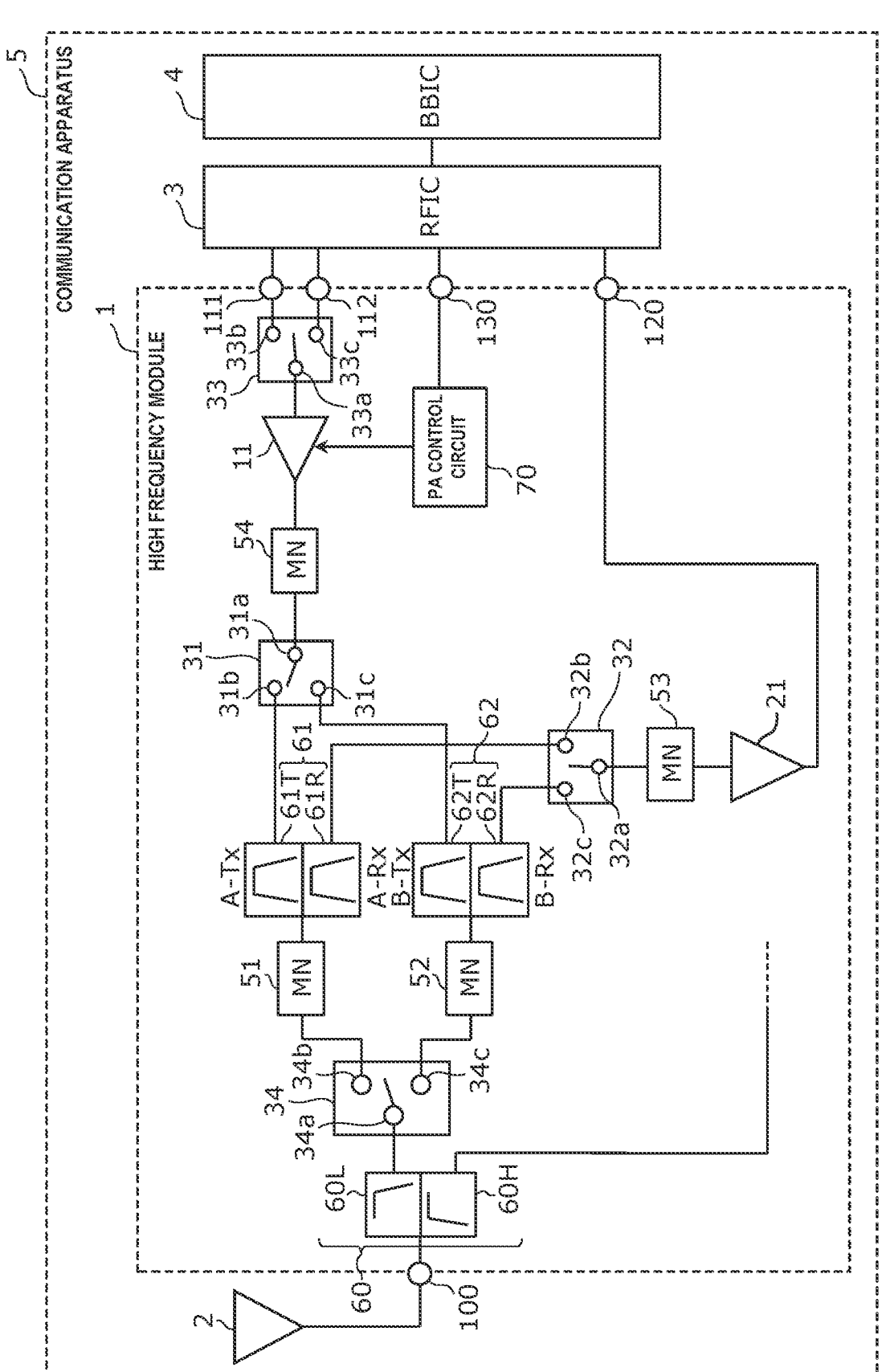
FIG. 1 is a circuit configuration diagram of a high frequency module and a communication apparatus according to an embodiment.

FIG. 1 is a circuit configuration diagram of a high frequency module 1 and a communication apparatus 5 according to an embodiment. As illustrated in FIG. 1, the communication apparatus 5 includes the high frequency module 1, an antenna 2, an RF signal processing circuit (RFIC) 3, and a baseband signal processing circuit (BBIC) 4.

The RFIC 3 is an RF signal processing circuit that processes a high frequency signal transmitted and received through the antenna 2. Specifically, the RFIC 3 performs signal processing such as down-conversion for a reception signal inputted through a reception path of the high frequency module 1 and outputs a reception signal generated by the signal processing to the BBIC 4. Furthermore, the RFIC 3 performs signal processing such as up-conversion for a transmission signal inputted from the BBIC 4 and outputs a transmission signal generated by the signal processing to a transmission path of the high frequency module 1.

The BBIC 4 is a circuit that performs signal processing using an intermediate frequency band that is lower than the frequency of a high frequency signal transferred in the high frequency module 1. For example, a signal processed at the BBIC 4 is used as an image signal for displaying an image or an audio signal for conversation through a speaker.

Furthermore, the RFIC 3 also includes a function as a controller that controls, based on a communication band (frequency band) used, the connection of switches 31, 32, 33, and 34 provided in the high frequency module 1. Specifically, the RFIC 3 switches, based on a control signal (not illustrated in FIG. 1), the connection of the switches 31 to 34 provided in the high frequency module 1. Specifically, the RFIC 3 outputs a digital control signal for controlling the switches 31 to 34 to a PA control circuit 70. The PA control circuit 70 of the high frequency module 1 controls the connection and disconnection of the switches 31 to 34 by outputting digital control signals, which have been inputted from the RFIC 3, to the switches 31 to 34.

Furthermore, the RFIC 3 also includes a function as a controller for controlling the gain of a power amplifier 11 provided in the high frequency module 1 and a power supply voltage Vcc and a bias voltage Vbias supplied to the power amplifier 11. Specifically, the RFIC 3 outputs digital control signals MIPI, GPIO, and the like to a control signal terminal 130 of the high frequency module 1. The PA control circuit 70 of the high frequency module 1 adjusts the gain of the power amplifier 11 by outputting a control signal, the power supply voltage Vcc, or the bias voltage Vbias to the power amplifier 11 in accordance with a digital control signal inputted through the control signal terminal 130. A control signal terminal that receives a digital control signal for controlling the gain of the power amplifier 11 from the RFIC 3 may be different from a control signal terminal that receives a digital control signal for controlling the power supply voltage Vcc and the bias voltage Vbias, which are supplied to the power amplifier 11, from the RFIC 3. A control circuit for controlling the connection and disconnection of the switches 31 to 34 may be a switch control circuit different from the PA control circuit 70. The controller may be provided outside the RFIC 3. The controller may be provided in, for example, the BBIC 4.

The antenna 2 is connected to an antenna connection terminal 100 of the high frequency module 1. The antenna 2 emits a high frequency signal outputted from the high frequency module 1. The antenna 2 also receives a high frequency signal from the outside and outputs the received high frequency signal to the high frequency module 1.

In the communication apparatus 5 according to this embodiment, neither the antenna 2 nor the BBIC 4 is an essential component element.

Next, a detailed configuration of the high frequency module 1 will be described.

As illustrated in FIG. 1, the high frequency module 1 includes the antenna connection terminal 100, the power amplifier 11, a low noise amplifier 21, the PA control circuit 70, transmission filters 61T and 62T, reception filters 61R and 62R, matching circuits 51, 52, 53, and 54, the switches 31, 32, 33, and 34, and a diplexer 60.

The antenna connection terminal 100 is an example of an input/output terminal and is an antenna common terminal connected to the antenna 2.

The power amplifier 11 is a transmission amplifier that amplifies high frequency signals of a communication band A and a communication band B inputted from transmission input terminals 111 and 112.

The PA control circuit 70 is an example of a control circuit that adjusts the gain of the power amplifier 11 in accordance with digital control signals MIPI, GPIO, and the like inputted through the control signal terminal 130. The PA control circuit 70 may be formed as a first semiconductor IC (Integrated Circuit). The first semiconductor IC includes, for example, a CMOS (Complementary Metal Oxide Semiconductor). Specifically, the first semiconductor IC is formed by a SOI (Silicon On Insulator) process. Thus, the first semiconductor IC can be manufactured with low cost. The first semiconductor IC may be made of at least one of GaAs, SiGe, and GaN. Thus, a high frequency signal with high-quality amplification performance and noise performance can be outputted.

The low noise amplifier 21 is a reception amplifier that amplifies high frequency signals of the communication band A and the communication band B with low noise and outputs the low-noise amplified high frequency signals to a reception output terminal 120.

The transmission filter 61T is connected to a transmission path that connects the transmission input terminals 111 and 112 to the antenna connection terminal 100 and allows a transmission signal of a transmission band of the communication band A, among transmission signals amplified by the power amplifier 11, to pass through. The transmission filter 62T is connected to a transmission path that connects the transmission input terminals 111 and 112 to the antenna connection terminal 100 and allows a transmission signal of a transmission band of the communication band B, among transmission signals amplified by the power amplifier 11, to pass through.

The reception filter 61R is connected to a reception path that connects the reception output terminal 120 to the antenna connection terminal 100 and allows a reception signal of a reception band of the communication band A, among reception signals inputted from the antenna connection terminal 100, to pass through. The reception filter 62R is connected to a reception path that connects the reception output terminal 120 to the antenna connection terminal 100 and allows a reception signal of a reception band of the communication band B, among reception signals inputted from the antenna connection terminal 100, to pass through.

The transmission filter 61T and the reception filter 61R configure a duplexer 61 that uses the communication band A as a pass band. The transmission filter 62T and the reception filter 62R configure a duplexer 62 that uses the communication band B as a pass band.

Each of the duplexers 61 and 62 may be a multiplexer including only a plurality of transmission filters, a multiplexer including only a plurality of reception filters, or a multiplexer including a plurality of duplexers.

The matching circuit 51 is connected to a signal path connecting the diplexer 60 to the duplexer 61 and performs impedance matching between the diplexer 60 and the duplexer 61. The matching circuit 52 is connected to a signal path connecting the diplexer 60 to the duplexer 62 and performs impedance matching between the diplexer 60 and the duplexer 62. The matching circuit 54 is connected to a transmission path connecting the power amplifier 11 to the transmission filters 61T and 62T and performs impedance matching between the power amplifier 11 and the transmission filters 61T and 62T. The matching circuit 53 is connected to a reception path connecting the low noise amplifier 21 to the reception filters 61R and 62R and performs impedance matching between the low noise amplifier 21 and the reception filters 61R and 62R.

The switch 31 includes a common terminal 31a and selection terminals 31b and 31c. The common terminal 31a is connected to an output terminal of the power amplifier 11 with the matching circuit 54 interposed therebetween. The selection terminal 31b is connected to the transmission filter 61T, and the selection terminal 31c is connected to the transmission filter 62T. With this connection configuration, the switch 31 switches between the connection between the common terminal 31a and the selection terminal 31b and the connection between the common terminal 31a and the selection terminal 31c. For example, the switch 31 includes a positive switch circuit of SPDT (Single Pole Double Throw) type.

The switch 32 includes a common terminal 32a and selection terminals 32b and 32c. The common terminal 32a is connected to an input terminal of the low noise amplifier 21 with the matching circuit 53 interposed therebetween. The selection terminal 32b is connected to the reception filter 61R, and the selection terminal 32c is connected to the reception filter 62R. With this connection configuration, the switch 32 switches between the connection and disconnection between the common terminal 32a and the selection terminal 32b and switches between the connection and disconnection between the common terminal 32a and the selection terminal 32c. For example, the switch 32 includes an SPDT switch circuit.

The switch 33 includes a common terminal 33a and selection terminals 33b and 33c. The common terminal 33a is connected to an input terminal of the power amplifier 11. The selection terminal 33b is connected to the transmission input terminal 111, and the selection terminal 33c is connected to the transmission input terminal 112. With this connection configuration, the switch 33 switches between the connection between the power amplifier 11 and the transmission input terminal 111 and the connection between the power amplifier 11 and the transmission input terminal 112. For example, the switch 33 includes an SPDT switch circuit.

For example, a transmission signal of the communication band A is inputted from the transmission input terminal 111. For example, a transmission signal of the communication band B is inputted from the transmission input terminal 112. For example, a transmission signal of the communication band A or B of the fourth generation mobile communication system (4G) may be inputted from the transmission input terminal 111. For example, a transmission signal of the communication band A or B of the fifth generation mobile communication system (5G) may be inputted from the transmission input terminal 112.

The switch 33 may be configured such that the common terminal 33a is connected to a transmission input terminal, the selection terminal 33b is connected to a first power amplifier that amplifies a transmission signal of the communication band A, and the selection terminal 33c is connected to a second power amplifier that amplifies a transmission signal of the communication band B.

Furthermore, the switch 33 may include a DPDT (Double Pole Double Throw) switch circuit including two common terminals and two selection terminals. In this case, the transmission input terminal 111 is connected to one common terminal, and the transmission input terminal 112 is connected to the other common terminal. Furthermore, the one common terminal is connected to a first power amplifier that amplifies a transmission signal of the communication band A, and the other common terminal is connected to a second power amplifier that amplifies a transmission signal of the communication band B. With this connection configuration, the switch 33 switches between the connection between the one common terminal and one selection terminal and the connection between the one common terminal and the other selection terminal or switches between the connection between the other common terminal and the one selection terminal and the connection between the other common terminal and the other selection terminal.

In this case, for example, a transmission signal of the communication band A is inputted from the transmission input terminal 111, and a transmission signal of the communication band B is inputted from the transmission input terminal 112. Furthermore, for example, transmission signals of the communication band A and the communication band B of 4G may be inputted from the transmission input terminal 111, and transmission signals of the communication band A and the communication band B of 5G may be inputted from the transmission input terminal 112.

The switch 34 is an example of an antenna switch and includes a common terminal 34a and selection terminals 34b and 34c. The common terminal 34a is connected to a filter 60L. The selection terminal 34*b* is connected to the duplexer 61 with the matching circuit 51 interposed therebetween, and the selection terminal 34*c* is connected to the duplexer 61 with the matching circuit 52 interposed therebetween. With this connection configuration, the switch 34 switches between the connection and disconnection between the common terminal 34*a* and the selection terminal 34*b* and switches between the connection and disconnection between the common terminal 34*a* and the selection terminal 34*c*. For example, the switch 34 includes an SPDT switch circuit. With the configuration described above, the switch 34 is connected to the antenna connection terminal 100 with the diplexer 60 interposed therebetween, and switches between (1) the connection with a signal path on which the antenna connection terminal 100 and the duplexer 61 are disposed and (2) the connection with a signal path on which the antenna connection terminal 100 and the duplexer 62 are disposed. The switch 34 includes a multiple-connection switch circuit that allows the connection of (1) mentioned above, the connection of (2) mentioned above, and the simultaneous connections of (1) and (2) mentioned above.

The diplexer 60 is an example of a multiplexer and includes the filter 60L and a filter 60H. The filter 60L is an example of an LC filter including at least one of an inductor and a capacitor of a chip shape and is a filter that uses a first frequency band group including the communication band A and the communication band B as a pass band. The filter 60H is an example of an LC filter including at least one of an inductor and a capacitor of a chip shape and is a filter that uses a second frequency band group including a frequency different from that in the first frequency band group as a pass band. One terminal of the filter 60L and one terminal of the filter 60H are connected in common to the antenna connection terminal 100. In the case where the first frequency band group is lower than the second frequency band group, the filter 60L may be a low pass filter and the filter 60H may be a high pass filter.

The transmission filters 61T and 62T and the reception filters 61R and 62R may be, for example, acoustic wave filters using SAW (Surface Acoustic Wave), acoustic wave filters using BAW (Bulk Acoustic Wave), LC resonant filters, or dielectric filters. Furthermore, the transmission filters 61T and 62T and the reception filters 61R and 62R are not limited to the filters mentioned above.

The power amplifier 11 and the low noise amplifier 21 are, for example, field effect transistors (FETs) or hetero-bipolar transistors (HBTs) made of Si-CMOS or GaAs.

Furthermore, the low noise amplifier 21 and the switches 32 and 34 may be formed in a second semiconductor IC. The second semiconductor IC may further include the power amplifier 11 and the switches 31 and 33. The second semiconductor IC includes, for example, a CMOS. Specifically, the second semiconductor IC is formed by a SOI process. Thus, the second semiconductor IC can be manufactured with low cost. The second semiconductor IC may be made of at least one of GaAs, SiGe, and GaN. Thus, a high frequency signal with high-quality amplification performance and noise performance can be outputted.

With the configuration of the high frequency module 1 described above, the switch 33, the power amplifier 11, the matching circuit 54, the switch 31, the transmission filter 61T, the matching circuit 51, the switch 34, and the filter 60L configure a first transmission circuit that transfers a transmission signal of the communication band A to the antenna connection terminal 100. Furthermore, the filter 60L, the switch 34, the matching circuit 51, the reception filter 61R, the switch 32, the matching circuit 53, and the low noise amplifier 21 configure a first reception circuit that transfers a reception signal of the communication band A through the antenna connection terminal 100 from the antenna 2.

Furthermore, the switch 33, the power amplifier 11, the matching circuit 54, the switch 31, the transmission filter 62T, the matching circuit 52, the switch 34, and the filter 60L configure a second transmission circuit that transfers a transmission signal of the communication band B to the antenna connection terminal 100. Furthermore, the filter 60L, the switch 34, the matching circuit 52, the reception filter 62R, the switch 32, the matching circuit 53, and the low noise amplifier 21 configure a second reception circuit that transfers a reception signal of the communication band B through the antenna connection terminal 100 from the antenna 2.

In a high frequency module according to the present disclosure, the above-mentioned two transmission circuits and the above-mentioned two reception circuits are not necessarily connected to the antenna connection terminal 100 with the switch 34 interposed therebetween. The two transmission circuits and the two reception circuits may be connected to the antenna 2 with a different terminal interposed therebetween. Furthermore, a high frequency module according to the present disclosure only needs to include at least one of the first transmission circuit and the second transmission circuit.

Furthermore, in a high frequency module according to the present disclosure, the first transmission circuit and the second transmission circuit may include at least the power amplifier 11.

In the high frequency module 1 according to this embodiment, a large amount of heat is generated by the power amplifier 11. Thus, heat dissipating means for the power amplifier 11 needs to be provided. Meanwhile, in the case where the high frequency module 1 is used for a high frequency front end circuit of a mobile terminal, the high frequency module 1 is required to be compact in size. That is, the size of the high frequency module 1 according to this embodiment needs to be reduced while still accommodating a heat dissipating means for the power amplifier 11.

Hereinafter, a configuration of the high frequency module 1 according to this embodiment, in which heat dissipation characteristics are improved and the size of the high frequency module 1 is reduced, will be described.

2. Arrangement of Circuit Elements of High Frequency Module 1A According to Example Each of FIGS. 2A and 2B is a schematic diagram of the planar configuration of a high frequency module 1A according to an example. FIG. 2C is a schematic diagram of the cross-section configuration of the high frequency module 1A according to the example, and more specifically, a cross-section diagram taken along line IIB-IIB in each of FIGS. 2A and 2B. FIG. 2A is a diagram illustrating the arrangement of circuit elements in the case where a main surface 91*a*, out of the main surface 91*a* and a main surface 91*b* of a module substrate 91 that face each other, is viewed from a positive z-axis direction. FIG. 2B is a perspective view of the arrangement of circuit elements in the case where the main surface 91*b* is viewed from the positive z-axis direction.

As the high frequency module 1A according to this example, the arrangement of circuit elements configuring the high frequency module 1 according to an embodiment is specifically illustrated.

As illustrated in FIGS. 2A, 2B and 2C, the high frequency module 1A according to this example includes, in addition to the circuit configuration illustrated in FIG. 1, the module substrate 91, resin members 92 and 93, and external connection terminals 150 and 151.

The module substrate 91 is a substrate that has the main surface 91a (first main surface) and the main surface 91b (second main surface) that face each other, and the transmission circuits and the reception circuits described above are mounted on the module substrate 91. For example, a low temperature co-fired ceramics (LTCC) substrate, a high temperature co-fired ceramics (HTCC) substrate, a component-embedded substrate, a substrate including a redistribution layer (RDL), a printed substrate, or the like is used as the module substrate 91. The antenna connection terminal 100, the transmission input terminals 111 and 112, the reception output terminal 120, and the control signal terminal 130 may be formed on the module substrate 91.

The resin member 92 is disposed on the main surface 91a of the module substrate 91, covers part of the transmission circuits, part of the reception circuits, and the main surface 91a of the module substrate 91, and has a function for ensuring reliability such as mechanical strength and moisture resistance of circuit elements configuring the transmission circuits and the reception circuits. The resin member 93 is disposed on the main surface 91b of the module substrate 91, covers part of the transmission circuits, part of the reception circuits, and the main surface 91b of the module substrate 91, and has a function for ensuring reliability such as mechanical strength and moisture resistance of circuit elements configuring the transmission circuits and the reception circuits. Neither the resin member 92 nor the resin member 93 is an essential component element of a high frequency module according to the present disclosure.

As illustrated in FIGS. 2A and 2B, in the high frequency module 1A according to this example, the power amplifier 11, the duplexers 61 and 62, the switch 33, the matching circuits 51 to 54, and the diplexer 60 are disposed on the main surface 91a of the module substrate 91. The PA control circuit 70, the low noise amplifier 21, and the switches 31, 32, and 34 are disposed on the main surface 91b of the module substrate 91.

Although not illustrated in FIGS. 2A and 2B, a wire configuring each of the transmission paths and each of the reception paths illustrated in FIG. 1 is formed inside the module substrate 91 and on the main surfaces 91a and 91b. Furthermore, the wire mentioned above may be a bonding wire with both ends bonded to any of the main surfaces 91a and 91b and a circuit element configuring the high frequency module 1A or may be a terminal, an electrode, or a wire formed on a surface of a circuit element configuring the high frequency module 1A.

Furthermore, each of the matching circuits 51 to 54 includes at least an inductor.

In the high frequency module 1A according to this example, a plurality of external connection terminals 150 and 151 are disposed on the main surface 91b side of the module substrate 91.

The antenna connection terminal 100 is one of the plurality of external connection terminals 150. The antenna connection terminal 100 is formed at a position on the main surface 91b that is adjacent to the diplexer 60 disposed on the main surface 91a in a plan view of the module substrate 91. With this arrangement, the length of a wire connecting the antenna connection terminal 100 to the diplexer 60 can be shortened. Thus, the transmission loss of the transmission and reception signals transferred in the high frequency module 1A can be reduced.

The transmission input terminals 111 and 112 are two of the plurality of external connection terminals 150. The transmission input terminals 111 and 112 are formed at positions on the main surface 91b that are adjacent to the switch 33 disposed on the main surface 91a in a plan view of the module substrate 91. With this arrangement, the length of a wire connecting the transmission input terminals 111 and 112 to the switch 33 can be shortened. Thus, the transmission loss of a transmission signal transferred in the high frequency module 1A can be reduced.

Furthermore, the reception output terminal 120 is one of the plurality of external connection terminals 150 and is formed at a position on the main surface 91b that is next to the low noise amplifier 21. With this arrangement, the length of a wire connecting the reception output terminal 120 to the low noise amplifier 21 can be shortened. Thus, the transmission loss of a reception signal transferred in the high frequency module 1A can be reduced.

The high frequency module 1A transmits and receives an electric signal to and from an external substrate that is disposed in a negative z-axis direction relative to the high frequency module 1A through the plurality of external connection terminals 150. Some of the plurality of external connection terminals 150 are set to a ground potential of the external substrate. The power amplifier 11, for which reduction of height is difficult to achieve, is not disposed on the main surface 91b that faces the external substrate, out of the main surfaces 91a and 91b. The low noise amplifier 21, the PA control circuit 70, and the switches 31, 32, and 34, for which reduction of height is easy to achieve, are disposed on the main surface 91b. Thus, the height of the entire high frequency module 1A can be reduced.

As illustrated in FIG. 2C, via conductors 95v that connect the main surfaces 91a and 91b are formed inside the module substrate 91. One end of each of the via conductors 95v is bonded to the ground electrode of the power amplifier 11 on the main surface 91a.

Each of the external connection terminals 151 is an example of a first external connection terminal. The external connection terminal 151 is disposed on the main surface 91b, set to the ground potential, and serves as a heat dissipating terminal for the power amplifier 11. As illustrated in FIG. 2C, the external connection terminal 151 has an end surface 151a (first end surface) and an end surface 151b (second end surface). On the main surface 91b, the end surface 151a is bonded to the other end of the via conductor 95v formed inside the module substrate 91.

The end surface 151a is a surface of an end portion of the external connection terminal 151 in the positive z-axis direction, and the end surface 151b is a surface of an end portion of the external connection terminal 151 in the negative z-axis direction.

As illustrated in FIG. 2C, an area Rb of the end surface 151b of the external connection terminal 151 is larger than an area Ra of any cut surface of the external connection terminal 151 other than the end surface 151b. The above-mentioned cut surface is a cut surface parallel to the main surface 91b. Cut surfaces of the external connection terminal 151 do not include the end surface 151b or the end surface 151a. For example, the area of the end surface 151a may be larger than the area Ra of any cut surface of the external connection terminal 151. Furthermore, the area of solder for bonding the end surface 151b to a connection electrode of the external substrate and a bonding surface of the connection electrode formed between the solder and the end surface 151b may be larger than the area Rb of the end surface 151a.

The power amplifier 11 is a component with a large amount of the heat generation among the circuit components provided in the high frequency module 1A. To improve the heat dissipation characteristics of the high frequency module 1A, it is effective to cause the heat generated by the power amplifier 11 to be dissipated to the external substrate through a heat dissipation path having a low thermal resistance. If the power amplifier 11 is disposed on the main surface 91*b*, an electrode wire connected to the power amplifier 11 is disposed on the main surface 91*b*. Thus, a heat dissipation path includes a path passing through only a planar wiring pattern on the main surface 91*b* (along an xy planar direction). The planar wiring pattern is formed of a metal thin film and thus has a high thermal resistance. Therefore, in the case where the power amplifier 11 is disposed on the main surface 91*b*, the heat dissipation characteristics degrade.

In contrast, in the case where the power amplifier 11 is disposed on the main surface 91*a*, the power amplifier 11 and the external connection terminals 151 can be connected through the via conductors 95*v* connecting the main surface 91*a* to the main surface 91*b*. Thus, a heat dissipation path passing through only a planar wiring pattern along the xy planar direction with a high thermal resistance among wires in the module substrate 91 can be excluded from a heat dissipation path for the power amplifier 11. Therefore, the characteristics of the heat dissipation from the power amplifier 11 to the external substrate can be improved.

Most of the heat generated by the power amplifier 11 is dissipated to the external substrate. From this point of view, as the contact area of the connection interface between the external substrate and the high frequency module 1A increases, thermal resistance at the connection interface decreases. Thus, the heat dissipation characteristics are improved.

Measures for increasing the contact area of the connection interface include increasing the number of external connection terminals 151 disposed and increasing the cross-section area of the entire external connection terminals 151. However, in this case, the distance between the external connection terminals 151 decreases, and a space for disposing circuit elements on the main surface 91*b* is restricted. Thus, characteristics may be degraded by mutual interference or size may be increased by securing the distance between circuit elements.

In contrast, in the high frequency module 1A, the area of the end surface 151*b* of the external connection terminal 151 that corresponds to the connection interface is larger than the area of any other cut surface. Thus, the characteristics of the heat dissipation from the external connection terminals 151 to the external substrate can be improved while a space for disposing circuit elements on the main surface 91*b* being secured. Accordingly, the high frequency module 1A of a compact size with excellent heat dissipation characteristics can be provided.

The external connection terminals 151, except for the end surfaces 151*a* and the end surfaces 151*b* thereof, are in contact with the resin member 93.

Furthermore, it is desirable that the external connection terminals 151 and the power amplifier 11 overlap in a plan view of the module substrate 91. Accordingly, the distance of the heat dissipation from the power amplifier 11 to the external substrate can be reduced to the minimum. Thus, the heat dissipation efficiency can be improved.

Furthermore, in the high frequency module 1A according to this example, the PA control circuit 70 (first circuit component) is disposed on the main surface 91*b* in such a manner that at least part of the PA control circuit 70 and the power amplifier 11 overlap in a plan view of the module substrate 91.

Thus, the wiring length of a control wire connecting the power amplifier 11 to the PA control circuit can be shortened. Therefore, the generation of the digital noise from the control wire and the like can be reduced.

Furthermore, as illustrated in FIG. 2C, the PA control circuit 70 has a main surface 70*a* (third main surface) that faces the main surface 91*b* and a main surface 70*b* (fourth main surface) that is located opposite to the main surface 70*a*. It is desirable that the length of a part 151X (first part) including the end surface 151*a* in the direction perpendicular to the main surface 91*b* be longer than the distance between the main surface 91*b* and the main surface 70*b*.

Thus, as illustrated in FIG. 2B, the PA control circuit 70 can be disposed in such a manner that the PA control circuit 70 and a part 151Y (second part) including the end surface 151*b* overlap in a plan view of the module substrate 91. Therefore, an area of the main surface 91*b* immediately below the power amplifier 11 can be effectively used as a space for disposing the PA control circuit 70. Thus, reducing the size of the high frequency module 1A can be prompted.

Furthermore, the first circuit component that is disposed on the main surface 91*b* in such a manner that the first circuit component and the power amplifier 11 overlap in a plan view of the module substrate 91 may be the switch 31.

Thus, the wiring length of a wire connecting the power amplifier 11 to the switch 31 can be shortened. Therefore, the transmission loss of a transmission signal outputted from the power amplifier 11 can be reduced.

The first circuit component is not necessarily the PA control circuit 70 or the switch 31. The first circuit component may be any of the duplexers 61 and 62, the switches 32 to 34, the matching circuits 51 to 54, the diplexer 60, and the low noise amplifier 21.

The external connection terminals 151 may have shapes illustrated in first to third modifications described below.

FIG. 3A is a schematic diagram of the cross-section configuration of an external connection terminal 151 according to the first modification. The external connection terminal 151 according to the first modification includes the part 151X (first part) including the end surface 151*a* and the part 151Y (second part) including the end surface 151*b*. Cut surfaces of the part 151X (first part) have the same area throughout the part 151X, and cut surfaces of the part 151Y (second part) have the same area throughout the part 151Y. The area of a cut surface of the part 151Y is larger than the area of a cut surface of the part 151X. The cut surface mentioned above is a cut surface in a direction parallel to the main surface 91*b*.

Thus, a space for disposing circuit elements on the main surface 91*b* can further be secured.

FIG. 3B is a schematic diagram of the cross-section configuration of an external connection terminal 151 according to the second modification. The external connection terminal 151 according to the second modification includes the part 151X (first part) including the end surface 151*a* and the part 151Y (second part) including the end surface 151*b*. Cut surfaces of the part 151X (first part) have the same area throughout the part 151X, and the area of a cut surface of the part 151Y (second part) increases as the cut surface is farther away from the end surface 151*a* and closer to the end surface 151*b*. The area of a cut surface of the part 151Y except for a boundary part that is in contact with the part 151X is larger than the area of a cut surface of the part 151X. The cut surface mentioned above is a cut surface in a direction parallel to the main surface 91*b*.

Thus, a space for disposing circuit elements on the main surface 91*b* can further be secured.

FIG. 3C is a schematic diagram of the cross-section configuration of an external connection terminal 151 according to the third modification. In the external connection terminal 151 according to the third modification, the area of a cut surface increases as the cut surface is farther away from the end surface 151*a* and closer to the end surface 151*b*. The area Rb of the end surface 151*b* is larger than the area Ra of the end surface 151*a*. The cut surface mentioned above is a cut surface in a direction parallel to the main surface 91*b*.

Thus, a space for disposing circuit elements on the main surface 91*b* can further be secured.

Furthermore, in the high frequency module 1A according to this example, the low noise amplifier 21 is disposed on the main surface 91*b*. Thus, the power amplifier 11 that amplifies a transmission signal and the low noise amplifier 21 that amplifies a reception signal are disposed with the module substrate 91 interposed therebetween, and the isolation between the transmission circuit and the reception circuit can be improved. Therefore, a situation in which a transmission signal, a harmonic wave, and an unwanted intermodulation distortion wave flow into the reception path and the reception sensitivity is thus degraded, can be suppressed.

It is desirable that the module substrate 91 have a multilayer structure in which a plurality of dielectric layers are laminated and that a ground electrode pattern be formed in at least one of the plurality of dielectric layers. Thus, an electromagnetic field shielding function of the module substrate 91 can be improved.

Furthermore, as in this example, the low noise amplifier 21 and the switches 31, 32, and 34 may be included in a single semiconductor IC 80. Thus, the height on the main surface 91*b* side in the z-axis direction can be reduced, and the area in which components are mounted on the main surface 91*b* can be reduced. Therefore, the size of the high frequency module 1A can further be reduced. Furthermore, the semiconductor IC 80 may include the PA control circuit 70.

In the high frequency module 1 according to an embodiment, the low noise amplifier 21, the PA control circuit 70, the duplexers 61 and 62, the switches 31 to 34, the matching circuits 51 to 54, and the diplexer 60 may be disposed on any of the main surface 91*a* and the main surface 91*b*.

3. Effects and so on

As described above, the high frequency module 1 according to an embodiment includes the module substrate 91 that includes the main surfaces 91*a* and 91*b* facing each other, the power amplifier 11 that is disposed on the main surface 91*a* and capable of amplifying a transmission signal, the external connection terminal 151 that is disposed on the main surface 91*b* and set to a ground potential, and the via conductor 95*v* that is formed inside the module substrate 91 and connects the main surfaces 91*a* and 91*b*. One end of the via conductor 95*v* is bonded to a ground electrode of the power amplifier 11 on the main surface 91*a*, and the other end of the via conductor 95*v* is bonded to the end surface 151*a* of the external connection terminal 151 on the main surface 91*b*. The area Rb of the end surface 151*b* that is opposite to the end surface 151*a* of the external connection terminal 151 is larger than the area of a cut surface that is in parallel to the main surface 91*b* of the external connection terminal 151.

As described above, the power amplifier 11 is disposed on the main surface 91*a*, and the power amplifier 11 and the external connection terminal 151 can be connected with the via conductor 95*v* interposed therebetween. Thus, the characteristics of the heat dissipation from the power amplifier 11 to an external substrate can be improved. Furthermore, the area of the end surface 151*b* of the external connection terminal 151 is larger than the area of another cut surface. Thus, the characteristics of the heat dissipation from the external connection terminal 151 to the external substrate can be improved while a space for disposing circuit elements on the main surface 91*b* being secured. Therefore, the high frequency module 1 of a compact size with excellent heat dissipation characteristics can be provided.

Furthermore, the external connection terminal 151, except for the end surface 151*a* and the end surface 151*b* thereof, may be in contact with the resin member 93.

Furthermore, the external connection terminal 151 and the power amplifier 11 may overlap in a plan view of the module substrate 91.

Thus, the distance of the heat dissipation from the power amplifier 11 to the external substrate can be reduced to the minimum. Therefore, the heat dissipation efficiency can be improved.

Furthermore, the high frequency module 1 may further include a first circuit component that is disposed on the main surface 91*b* in such a manner that at least part of the first circuit component and the power amplifier 11 overlap in a plan view of the module substrate 91.

Furthermore, the first circuit component may be the PA control circuit 70.

Thus, the wiring length of a control wire connecting the power amplifier 11 to the PA control circuit can be shortened. Therefore, the generation of the digital noise from the control wire and the like can be reduced.

Furthermore, the first circuit component may be the switch 31.

Thus, the wiring length of a wire connecting the power amplifier 11 to the switch 31 can be shortened. Therefore, the transmission loss of a transmission signal outputted from the power amplifier 11 can be reduced.

Furthermore, the external connection terminal 151 may include the part 151X including the end surface 151*a* and the part 151Y including the end surface 151*b*. The area Rb of a cut surface of the part 151Y in a direction parallel to the main surface 91*b* may be larger than the area of a cut surface of the part 151X in the direction parallel to the main surface 91*b*.

Thus, a space for disposing circuit elements on the main surface 91*b* can further be secured.

Furthermore, the first circuit component may have a third main surface that faces the main surface 91*b* and a fourth main surface that is located opposite to the third main surface, and the length of the part 151X in a direction perpendicular to the main surface 91*b* may be longer than the distance between the main surface 91*b* and the fourth main surface.

Thus, the first circuit component can be disposed in such a manner that the first circuit component and the part 151Y overlap in a plan view of the module substrate 91. Therefore, an area of the main surface 91*b* immediately below the power amplifier 11 can be effectively used as a space for disposing the first circuit component. Thus, reducing the size of the high frequency module 1 can be prompted.

Furthermore, the area of a cut surface of the external connection terminal 151 in the direction parallel to the main surface 91b may increase as the cut surface is farther away from the end surface 151a and closer to the end surface 151b.

Thus, a space for disposing circuit elements on the main surface 91b can be secured.

Furthermore, the high frequency module 1 may further include the low noise amplifier 21 that is disposed on the main surface 91b and capable of amplifying a reception signal.

Thus, the power amplifier 11 that amplifies a transmission signal and the low noise amplifier 21 that amplifies a reception signal are disposed with the module substrate 91 interposed therebetween. Therefore, the isolation between a transmission circuit and a reception circuit can be improved.

Furthermore, the communication apparatus 5 includes the antenna 2, the RFIC 3 that processes a high frequency signal transmitted and received through the antenna 2, and the high frequency module 1 that transfers a high frequency signal to and from the antenna 2 and the RFIC 3.

Thus, the communication apparatus 5 of a compact size with excellent heat dissipation characteristics can be provided.

Other Embodiments and so on

A high frequency module and a communication apparatus according to an embodiment of the present disclosure have been described above by way of an embodiment, an example, and modifications. However, a high frequency module and a communication apparatus according to the present disclosure is not limited to the embodiment, the example, and the modifications described above. Other embodiments implemented by combining desired component elements in the embodiment, the example, and the modifications described above, modifications obtained by making various changes conceived by those skilled in the art to the embodiment, the example, and the modifications described above without departing from the gist of the present disclosure, and various types of equipment in which the high frequency module and the communication apparatus are built are also included in the present disclosure.

For example, in the high frequency modules and the communication apparatuses according to the embodiment and the example described above, other circuit elements, wires, and the like may be inserted between paths that connect circuit elements and signal paths disclosed in the drawings.

The present disclosure can be widely used as a high frequency module disposed in a front end unit that supports multiple bands for communication equipment such as cellular phones.

1, 1A high frequency module
2 antenna
3 RF signal processing circuit (RFIC)
4 baseband signal processing circuit (BBIC)
5 communication apparatus
11 power amplifier
21 low noise amplifier
31, 32, 33, 34 switch
31a, 32a, 33a, 34a common terminal
31b, 31c, 32b, 32c, 33b, 33c, 34b, 34c selection terminal
51, 52, 53, 54 matching circuit
60 diplexer
60H, 60L filter
61, 62 duplexer
61R, 62R reception filter
61T, 62T transmission filter 70 PA control circuit
70a, 70b, 91a, 91b main surface
80 semiconductor IC
91 module substrate
92, 93 resin member
95v via conductor
100 antenna connection terminal
111, 112 transmission input terminal
120 reception output terminal
130 control signal terminal
150, 151 external connection terminal
151a, 151b end surface
151X, 151Y part

The invention claimed is:

1. A high frequency module comprising:
a module substrate having a first main surface and a second main surface facing each other;
a power amplifier disposed on the first main surface and configured to amplify a transmission signal;
a first external connection terminal disposed on the second main surface and set to a ground potential;
a via conductor provided inside the module substrate and connecting the first main surface to the second main surface; and
a first circuit component disposed on the second main surface in such a manner that at least part of the first circuit component is overlapped with the power amplifier in a plan view of the module substrate,
wherein one end of the via conductor is bonded to a ground electrode of the power amplifier on the first main surface, and another end of the via conductor is bonded to a first end surface of the first external connection terminal on the second main surface,
wherein an area of a second end surface opposite to the first end surface of the first external connection terminal is larger than an area of a cut surface in parallel to the second main surface of the first external connection terminal, and
wherein the first circuit component overlaps the second end surface of the first external connection terminal.

2. The high frequency module according to claim 1, further comprising:
a resin member disposed on the second main surface,
wherein the first external connection terminal, except for the first end surface and the second end surface thereof, is in contact with the resin member.

3. The high frequency module according to claim 2, wherein the first external connection terminal and the power amplifier overlap in a plan view of the module substrate.

4. The high frequency module according to claim 2, further comprising a first circuit component disposed on the second main surface in such a manner that at least part of the first circuit component is overlapped with the power amplifier in a plan view of the module substrate.

5. The high frequency module according to claim 2, wherein an area of a cut surface of the first external connection terminal in a direction parallel to the second main surface increases as the cut surface is farther away from the first end surface and closer to the second end surface.

6. The high frequency module according to claim 1, wherein the first external connection terminal and the power amplifier overlap in a plan view of the module substrate.

7. The high frequency module according to claim 6, further comprising a first circuit component disposed on the second main surface in such a manner that at least part of the first circuit component is overlapped with the power amplifier in a plan view of the module substrate.

8. The high frequency module according to claim 7, wherein an area of a cut surface of the first external connection terminal in a direction parallel to the second main surface increases as the cut surface is farther away from the first end surface and closer to the second end surface.

9. The high frequency module according to claim 6, wherein an area of a cut surface of the first external connection terminal in a direction parallel to the second main surface increases as the cut surface is farther away from the first end surface and closer to the second end surface.

10. The high frequency module according to claim 1, wherein the first circuit component is a switch connected to an output terminal of the power amplifier.

11. The high frequency module according to claim 10, wherein the first external connection terminal includes a first part including the first end surface, and a second part including the second end surface, and wherein an area of a cut surface of the second part in a direction parallel to the second main surface is larger than an area of a cut surface of the first part in the direction parallel to the second main surface.

12. The high frequency module according to claim 1, wherein the first external connection terminal includes a first part including the first end surface, and a second part including the second end surface, and wherein an area of a cut surface of the second part in a direction parallel to the second main surface is larger than an area of a cut surface of the first part in the direction parallel to the second main surface.

13. The high frequency module according to claim 12, wherein the first circuit component has a third main surface facing the second main surface and a fourth main surface located opposite to the third main surface, and wherein a length of the first part in a direction perpendicular to the second main surface is longer than a distance between the second main surface and the fourth main surface.

14. The high frequency module according to claim 1, wherein an area of a cut surface of the first external connection terminal in a direction parallel to the second main surface increases as the cut surface is farther away from the first end surface and closer to the second end surface.

15. The high frequency module according to claim 1, further comprising a low noise amplifier disposed on the second main surface and configured to amplify a reception signal.

16. A communication apparatus comprising:
an antenna;
an RF signal processing circuit configured to process a high frequency signal transmitted and received through the antenna; and
the high frequency module according to claim 1 configured to transfer the high frequency signal to and from the antenna and the RF signal processing circuit.

17. The high frequency module according to claim 1, wherein a heat dissipation path is formed between the power amplifier and the second end surface.

18. The high frequency module according to claim 1, wherein the second end surface is flush with a resin member.

19. A high frequency module comprising:
a module substrate having a first main surface and a second main surface facing each other;
a power amplifier disposed on the first main surface and configured to amplify a transmission signal;
a first external connection terminal disposed on the second main surface and set to a ground potential; and
a via conductor provided inside the module substrate and connecting the first main surface to the second main surface,
wherein one end of the via conductor is bonded to a ground electrode of the power amplifier on the first main surface, and another end of the via conductor is bonded to a first end surface of the first external connection terminal on the second main surface,
wherein an area of a second end surface opposite to the first end surface of the first external connection terminal is larger than an area of a cut surface in parallel to the second main surface of the first external connection terminal,
wherein a first circuit component overlaps the second end surface of the first external connection terminal, and
wherein the first circuit component is a control circuit configured to control the power amplifier.

20. The high frequency module according to claim 19, wherein the first external connection terminal includes a first part including the first end surface, and a second part including the second end surface, and wherein an area of a cut surface of the second part in a direction parallel to the second main surface is larger than an area of a cut surface of the first part in the direction parallel to the second main surface.

21. The high frequency module according to claim 19, wherein an area of a cut surface of the first external connection terminal in a direction parallel to the second main surface increases as the cut surface is farther away from the first end surface and closer to the second end surface.

* * * * *